United States Patent
Kosugi

(10) Patent No.: US 9,300,207 B2
(45) Date of Patent: Mar. 29, 2016

(54) SWITCHING CONTROL CIRCUIT AND CONTROL METHOD THEREOF

(71) Applicant: Hajime Kosugi, Okazaki (JP)

(72) Inventor: Hajime Kosugi, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 246 days.

(21) Appl. No.: 14/033,905

(22) Filed: Sep. 23, 2013

(65) Prior Publication Data

US 2014/0111171 A1    Apr. 24, 2014

(30) Foreign Application Priority Data

Oct. 24, 2012    (JP) ................. 2012-234815

(51) Int. Cl.
| | |
|---|---|
| H02M 3/158 | (2006.01) |
| H02M 7/51 | (2006.01) |
| H02M 7/5387 | (2007.01) |
| H02M 1/38 | (2007.01) |
| H02M 3/08 | (2006.01) |
| H02M 5/32 | (2006.01) |
| H02M 1/08 | (2006.01) |
| H02M 1/32 | (2007.01) |
| H02M 1/36 | (2007.01) |
| H03K 17/16 | (2006.01) |

(52) U.S. Cl.
CPC ............... *H02M 3/158* (2013.01); *H02M 1/08* (2013.01); *H02M 1/32* (2013.01); *H02M 1/36* (2013.01); *H03K 17/166* (2013.01); *H02M 1/38* (2013.01); *H02M 7/51* (2013.01); *H02M 7/5387* (2013.01)

(58) Field of Classification Search
USPC .................. 323/271, 273–280; 363/55–56.11
See application file for complete search history.

(56) References Cited

U.S. PATENT DOCUMENTS

2009/0256618 A1 * 10/2009 Yamawaki et al. ........... 327/377

FOREIGN PATENT DOCUMENTS

| JP | A-7-255182 | 10/1995 |
|---|---|---|
| JP | A-2012-049616 | 3/2012 |
| JP | 2012147625 A * | 8/2012 |
| JP | A-2012-147625 | 8/2012 |

* cited by examiner

*Primary Examiner* — Timothy J Dole
*Assistant Examiner* — Bryan R. Perez
(74) *Attorney, Agent, or Firm* — Oliff PLC

(57) ABSTRACT

A switching control circuit includes voltage application means that applies a first voltage to a gate of a power device in a first period and applies a second voltage to the gate of the power device in a second period, wherein the first period starts when the power device is turned on; current detection means that detects whether a current flowing through the power device exceeds a threshold; and voltage decrease means that decreases the voltage with a first speed if the current detection means detects that the current exceeds the threshold in a second detection period, decreases the gate voltage with a second speed, lower than the first speed, if the current detection means detects that the current exceeds the threshold in a third detection period, and does not decrease the gate voltage if the current detection means detects that the current exceeds the threshold in the first period.

3 Claims, 6 Drawing Sheets

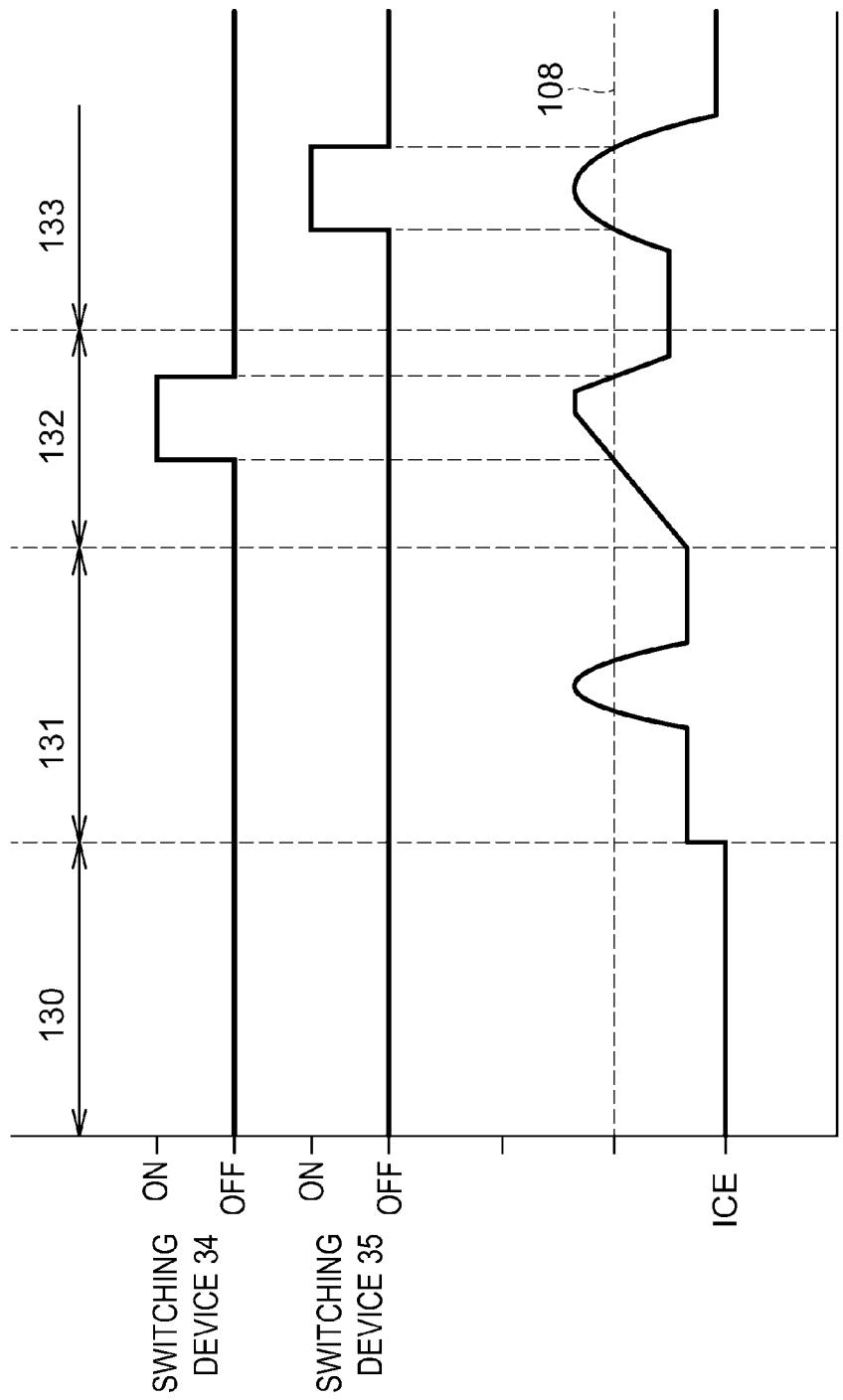

SWITCHING CONTROL CIRCUIT AND CONTROL METHOD THEREOF

INCORPORATION BY REFERENCE

The disclosure of Japanese Patent Application No. 2012-234815 filed on Oct. 24, 2012 including the specification, drawings and abstract is incorporated herein by reference in its entirety.

BACKGROUND OF THE INVENTION

1. Field of the Invention

The present invention relates to a switching control circuit and its control method for controlling between the on state and the off state of a power device.

2. Description of Related Art

A device such as an inverter usually has a plurality of power devices and a switching control circuit that controls the on/off state of the power devices. In some cases, this type of switching control circuit includes a protection circuit that protects the device against a short circuit current that flows when a short circuit occurs between the upper arm and the lower arm. For example, when an open fault occurs in the power device of one of the upper arm and the lower arm with the result that the arms are short-circuited, the protection circuit detects a short circuit current flowing in the power device that has no open fault and turns off the power device. The inverter protection circuit disclosed in Japanese Patent Application Publication No. 7-255182 (JP 7-255182) is configured such that, when a short circuit is detected in one of the arms, the protection circuit slowly decreases the gate potential of the power device of the other arm. Decreasing the gate potential in this manner slowly turns off the current flowing in the power device, thus preventing the power device from being destroyed by a surge voltage.

The protection circuit of a switching control circuit sometimes disables its function for a predetermined period (mask period) immediately after the power device is turned on. Disabling the protection function in this way prevents the protection circuit from detecting an inrush current, which flows at turn-on time, as a short circuit and from turning off the power device. However, if a short circuit actually occurs in the power device of one of the arms during the mask period in this switching control circuit, the short circuit current continues to flow into the power device of the other arm. As a result, when a short circuit occurs in the power device of one of the arms during the mask period, a large amount of energy is accumulated in the power device of the other arm.

The inverter protection circuit, disclosed in Japanese Patent Application Publication No. 7-255182 (JP 7-255182), slowly turns off a power device and, therefore, generates a large off-state power loss with the result that a large amount of energy is applied to the power device at turn-off time. Therefore, when a mask period is provided in the protection circuit and a short circuit occurs during that mask period, a large amount of energy, which is applied at turn-off time, is further added to the power device in which the energy is already accumulated during the mask period. As a result, the total amount of applied energy exceeds the energy tolerance limit of the power device, sometimes leading to the destruction of the power device.

SUMMARY OF THE INVENTION

The present invention provides a technology for a switching control circuit, which includes a protection circuit having a mask period, for preventing a power device from being destroyed by an energy that exceeds the energy tolerance limit and from being destroyed by a surge voltage.

According to a first aspect of the present invention, a switching control circuit includes voltage application means that applies a first voltage to a gate of a power device in a first period and applies a second voltage to the gate of the power device in a second period, the first period starting when the power device is switched from off to on, the second period starting after the first period has elapsed and ending when the power device is turned off; current detection means that detects whether a current flowing through the power device exceeds a threshold; and voltage decrease means that decreases the voltage, which is applied to the gate of the power device, with a first speed if the current detection means detects that the current flowing through the power device exceeds the threshold in a second detection period, and decreases the gate voltage with a second speed, which is lower than the first speed, if the current detection means detects that the current flowing through the power device exceeds the threshold in a third detection period, the second detection period starting after a first detection period has elapsed, the first detection period starting from the time the power device is switched from off to on, the third detection period, starting after the second detection period has elapsed, wherein, in the first detection period, the power decrease means does not decrease the gate voltage of the power device even if the current detection means detects that the current flowing through the power device exceeds the threshold.

According to a second aspect of the present invention, a control method for a switching control circuit that switches a power device, which has an insulated gate, between on and off, includes applying a first voltage to a gate of the power device until a first period elapses, the first period starting when the power device is switched from off to on; applying a second voltage to the gate of the power device in a second period, the second period starting after the first period has elapsed and ending when the power device is turned off; increasing the voltage, which is applied to the gate of the power device, from the first voltage to the second voltage in a transition period, the transition period starting at a start of the second period; not decreasing the gate voltage of the power device even if the current value of the current flowing through the power device exceeds a pre-set threshold in a first detection period, the first detection period starting from the time the power device is switched from off to on; decreasing the voltage, which is applied to the gate of the power device, with a first speed if the current flowing through the power device exceeds the threshold in a second detection period, the second detection period starting after the first detection period has elapsed; and decreasing the voltage, which is applied to the gate of the power device, with a second speed that is lower than the first speed if the current value of the current flowing through the power device exceeds the threshold in a third detection period, the third detection period starting after the second detection period has elapsed; wherein an end of the second detection period is earlier than an end of the transition period.

As described above, the switching control circuit prevents a power device from being destroyed by an energy that exceeds the energy tolerance limit and from being destroyed by a surge voltage.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 6 is a diagram showing the relation between the time $t_m$ versus the collector current $I_{ce}$ and states of switching devices, in the switching control according to one embodiment.

DETAILED DESCRIPTION OF EMBODIMENTS

In a switching control circuit disclosed by the present invention, the voltage decrease means may include a first gate-off line that connects the gate of the power device and a grounding potential; a second gate-off line that connects the gate of the power device and a grounding potential; a first switching device that switches the first gate-off line between a conductive state and a non-conductive state; a second switching device that switches the second gate-off line between a conductive state and a non-conductive state; and a driving circuit that turns on/off the first switching device and the second switching device. In the switching control circuit, a resistance value of the second gate-off line may be higher than a resistance value of the first gate-off line. In the switching control circuit, the driving circuit may turn off the first switching device and the second switching device even if the current detection means detects that the current flowing through the power device exceeds the threshold in the first detection period, turn on the first switching device and turns off the second switching device if the current detection means detects that the current flowing through the power device exceeds the threshold in the second detection period, and turn off the first switching device and turns on the second switching device if the current detection means detects that the current flowing through the power device exceeds the threshold in the third detection period.

Figure 1:
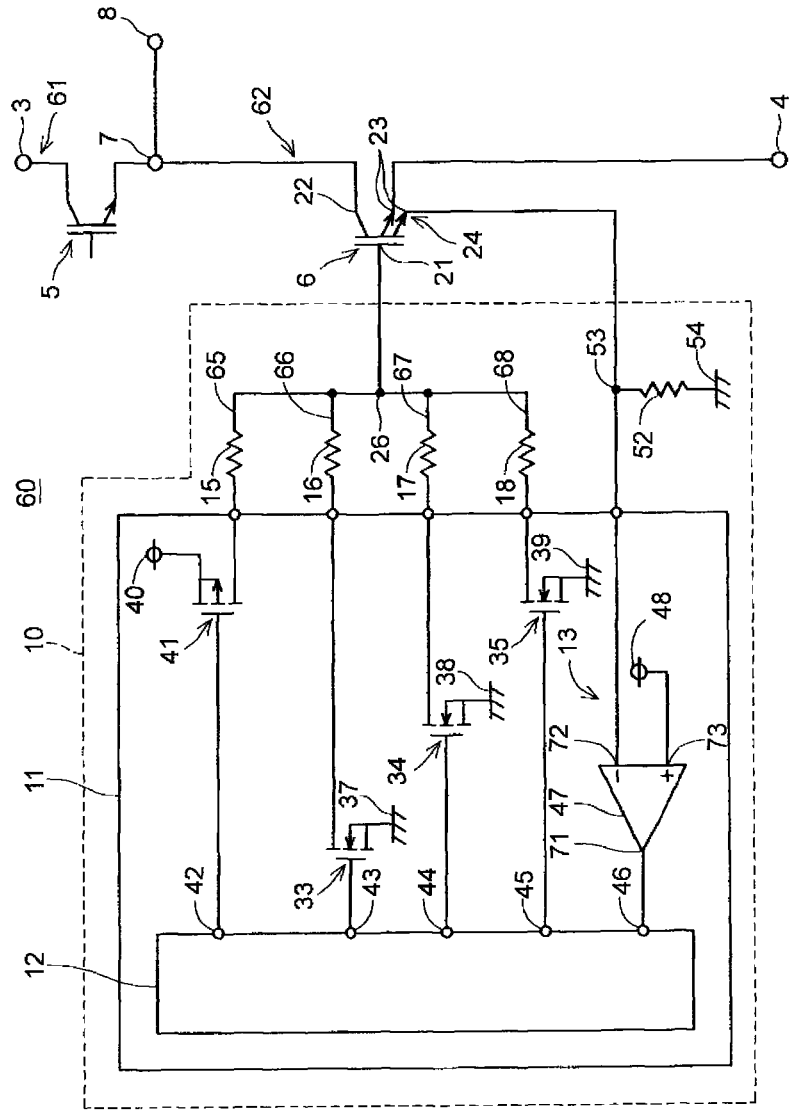
FIG. 1 is a diagram showing a circuit configuration of a switching control circuit in an exemplary embodiment of the present invention.

A switching control circuit 10 in this exemplary embodiment switches between the on and the off states of a power device 6. As shown in FIG. 1, the power device 6 is arranged in one of an upper arm 61 and a lower arm 62 of an inverter 60 (in this exemplary embodiment, the power device 6 is arranged in the lower arm 62 (FIG. 1)). The inverter 60 is a three-phase inverter. The part of the inverter 60 except the upper arm 61 and the lower arm 62 is known and therefore is omitted in the drawing.

An upper end 3 of the upper arm 61 of the inverter 60 is connected to the positive electrode (not shown) of the power supply. A lower end 4 of the lower arm 62 is connected to the grounding potential (not shown). The lower end of the upper arm 61 and the upper end of the lower arm 62 are connected at a connection point 7 that is connected to a terminal 8. The terminal 8 is connected to one of the terminals of a load (for example, a motor (not shown)). A power device 5 is arranged in the upper arm 61. That is, the power device 6 and the power device 5 are connected in series.

When the inverter 60 is used in the normal mode, the power device 6 and the power device 5 are turned on and off alternately. However, when the power device 6 and the power device 5 are in the conductive state at the same time, for example, due to a failure in the power devices, a short circuit occurs between the upper arm 61 and the lower arm 62. For example, when the power device 6 is turned on with an open fault in the power device 5, a short circuit occurs between the upper arm 61 and the lower arm 62. Similarly, when an open fault is generated in the power device 5 with the power device 6 turned on, a short circuit occurs between the upper arm 61 and the lower arm 62.

The power device 6 is an insulated gate transistor, more specifically, an insulated gate bipolar transistor (IGBT). The power device 6 may also be a metal-oxide-semiconductor field-effect transistor (MOSFET) or the like. In the power device 6, when the gate-on voltage is applied to a gate 21, a collector 22 and an emitter 23 are in the conductive state and, when the gate-on voltage is not applied to the gate 21, the collector 22 and the emitter 23 are in the non-conductive state. A collector current $I_{ce}$ flows between the collector 22 and the emitter 23 of the power device 6. The power device 6 has a sense region 24 (hereinafter called a sense IGBT 24) for detecting the current $I_{ce}$ that flows through the power device 6. In this exemplary embodiment, the current flowing through the power device 6 is detected by detecting the current (sense current) that flows through the sense IGBT 24.

Figure 2:
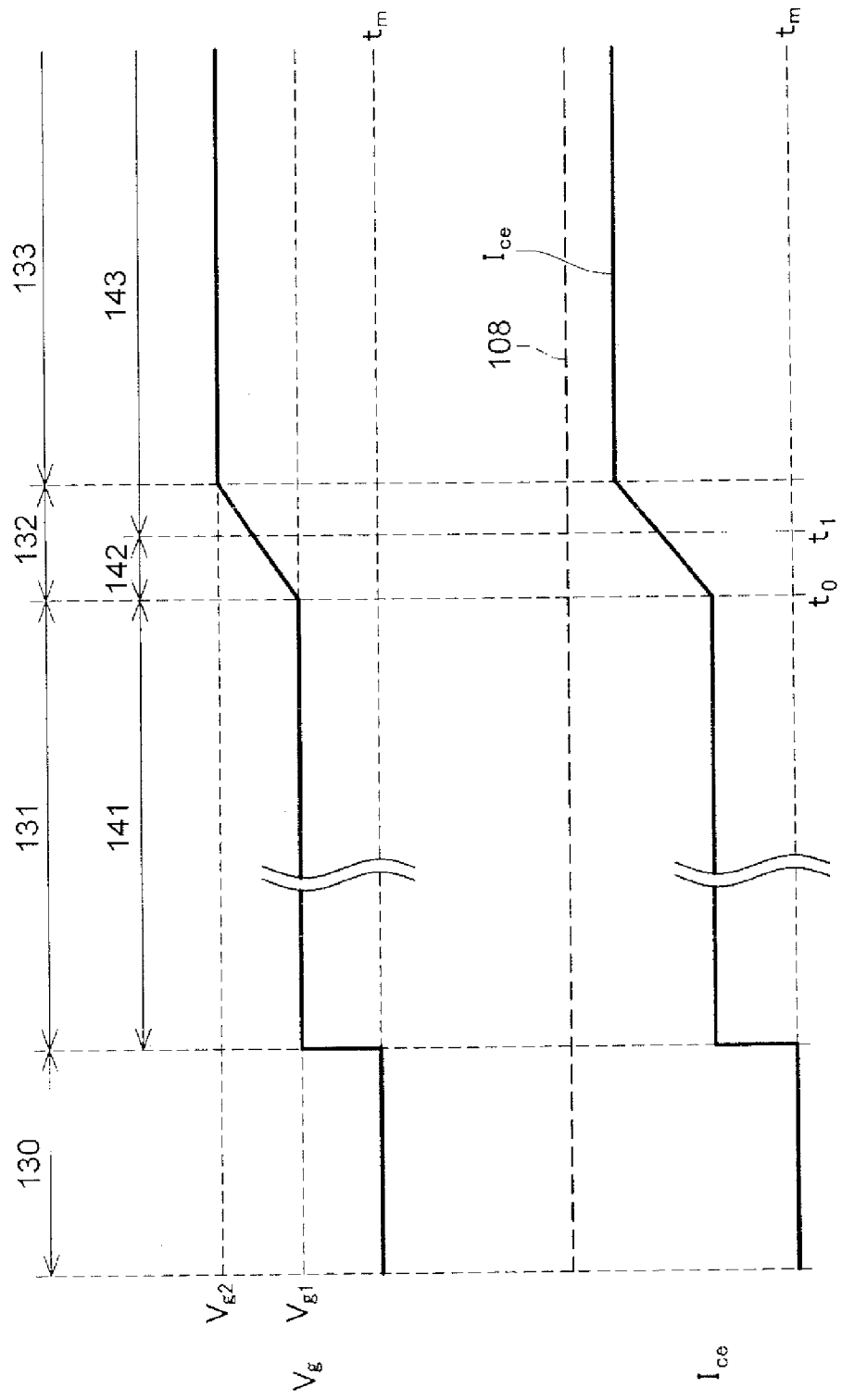
FIG. 2 is a diagram showing the relation between the time $t_m$ versus the gate voltage $V_g$ and the collector current $I_{ce}$ in the switching control circuit in the exemplary embodiment of the present invention.
Figure 3:
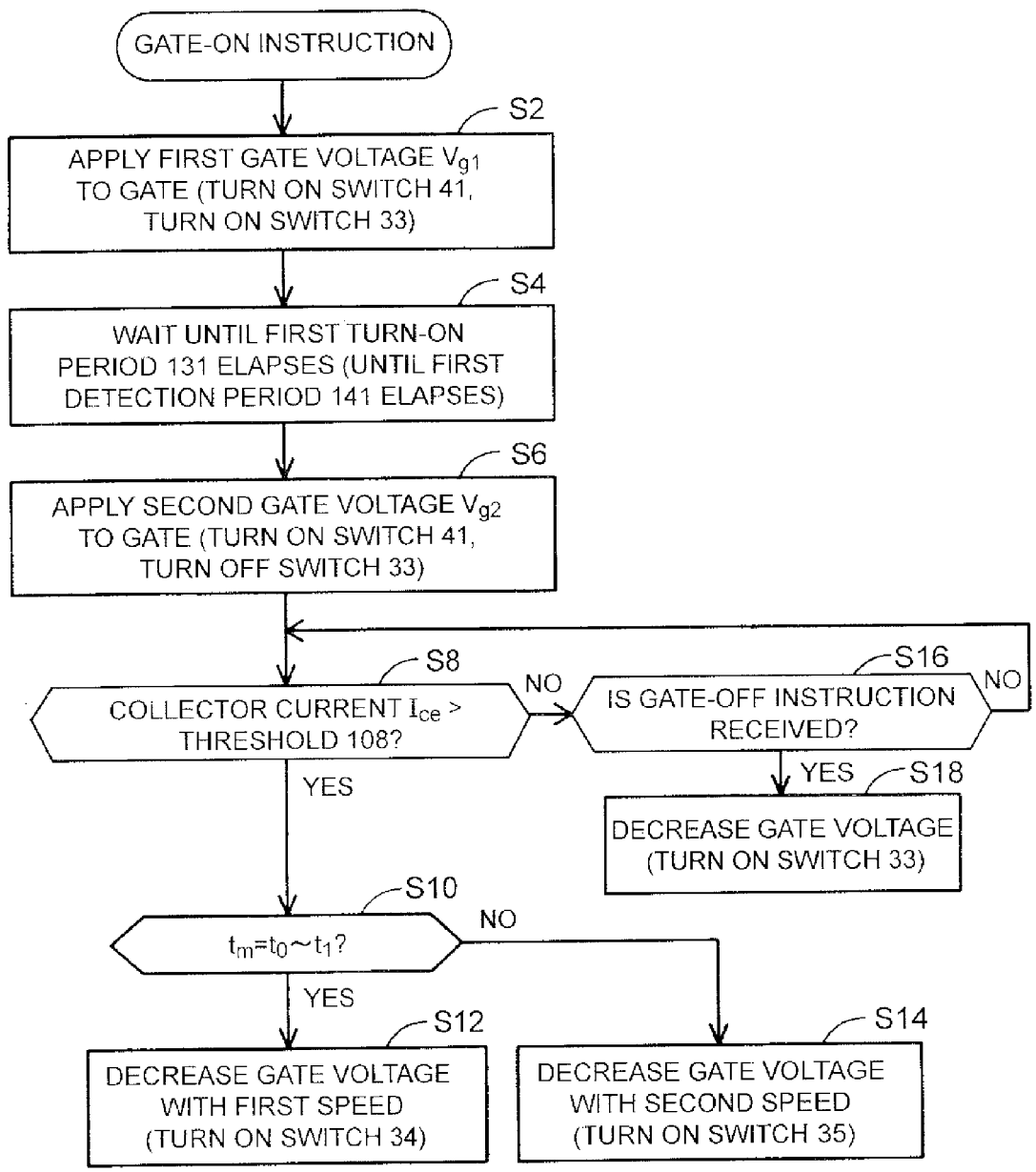
FIG. 3 is a flowchart showing an operation of the switching control circuit in the exemplary embodiment of the present invention.
Figure 4:
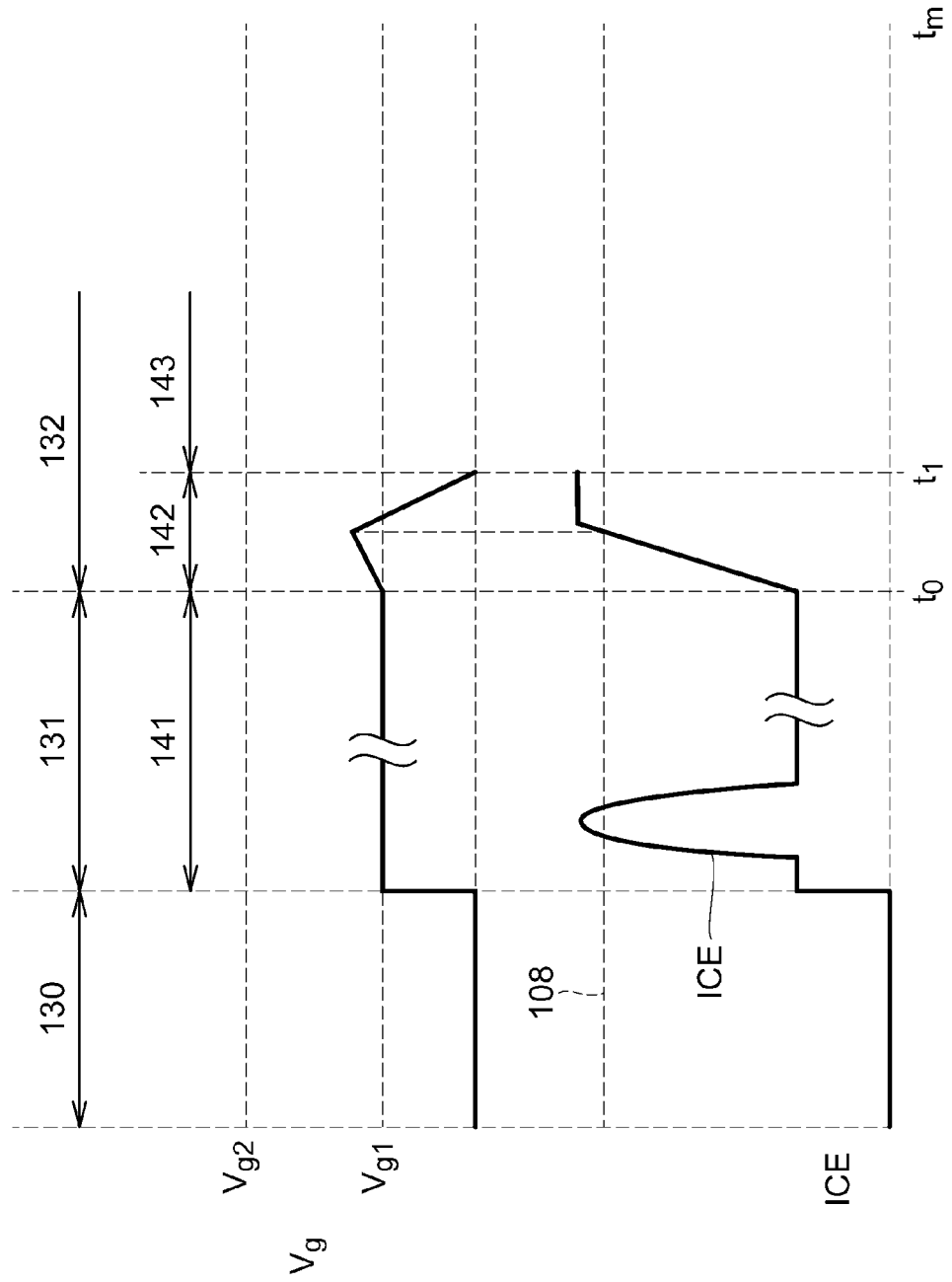
FIG. 4 is a diagram showing the relation between the time $t_m$ versus the gate voltage $V_g$ and the collector current $I_{ce}$ in the switching control according to one embodiment.
Figure 5:
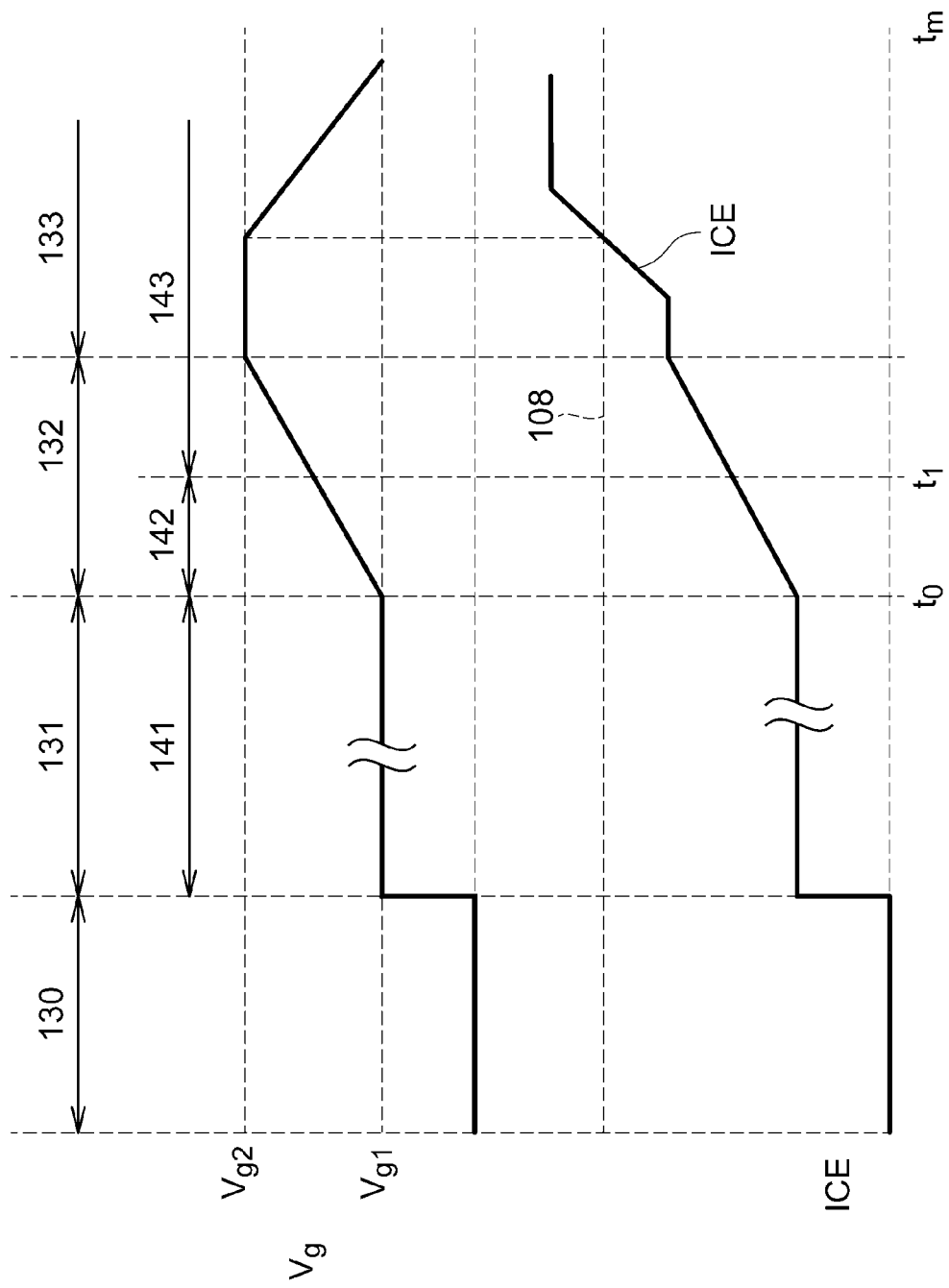
FIG. 5 is a diagram showing the relation between the time $t_m$ versus the gate voltage $V_g$ and the collector current $I_{ce}$ in the switching control according to one embodiment.

The switching control circuit 10 includes a control device 12 and a current detection circuit 13. The control device 12 turns on the power device 6 when a gate-on instruction is received from an input terminal (not shown), and turns off the power device 6 when a gate-off instruction is received (FIG. 3). The control device 12 turns off the power device 6 also when the current flowing through the power device 6 exceeds a threshold 108 (FIG. 2) (this operation will be described in detail later). The control device 12 and switching devices 41, 33, 34 and 35 and a comparator 47, which are described below, are mounted on a substrate 11.

Gate driving lines 65, 66, 67, and 68 are connected to the gate 21 of the gate 21 of the power device 6. The switching devices 41, 33, 34, and 35 are provided on the gate driving lines 65, 66, 67, and 68, respectively. For example, a MOSFET may be used for the switching devices 41, 33, 34, and 35. The control device 12 outputs the control signal to each gate of the switching devices 41, 33, 34, and 35 to switch the on/off state of the switching devices 41, 33, 34, and 35. Switching the on/off state of the switching devices 41, 33, 34, and 35 switches the conductive/non-conductive state of the gate driving lines 65, 66, 67, and 68. The following describes the gate driving lines 65, 66, 67, and 68 more in detail.

One end of the gate driving line 65 is connected to the gate 21, and the other end is connected to a reference potential 40. The switching device 41 is arranged on the gate driving line 65. The control signal from an output terminal 42 of the control device 12 is input to the gate of the switching device 41. A resistor 15 is provided on the gate driving line 65 with the resistor 15 arranged between the gate 21 and the switching device 41.

One end of the gate driving line 66 is connected to the gate 21, and the other end is connected to a grounding potential 37. The switching device 33 is arranged on the gate driving line 66. The control signal from an output terminal 43 of the control device 12 is input to the gate of the switching device 33. A resistor 16 is provided on the gate driving line 66 with the resistor 16 arranged between the gate 21 and the switching device 33.

One end of the gate driving line 67 is connected to the gate 21, and the other end is connected to a grounding potential 38. The switching device 34 is arranged on the gate driving line 67. The control signal from an output terminal 44 of the control device 12 is input to the gate of the switching device 34. A resistor 17 is provided on the gate driving line 67 with the resistor 17 arranged between the gate 21 and the switching device 34.

One end of the gate driving line 68 is connected to the gate 21, and the other end is connected to a grounding potential 39. The switching device 35 is arranged on the gate driving line 68. The control signal from an output terminal 45 of the control device 12 is input to the gate of the switching device 35. A resistor 18 is provided on the gate driving line 68 with the resistor 18 arranged between the gate 21 and the switching device 35.

The resistance value $R_{18}$ of the resistor 18 is higher than the resistance value $R_{17}$ of the resistor 17. The resistance value $R_{17}$ of the resistor 17 is higher than the resistance value $R_{16}$ of the resistor 16.

The switching control circuit 10 includes the current detection circuit 13. The current detection circuit 13 includes a resistor 52, the comparator 47, and a comparison potential 48.

The collector terminal of the sense IGBT 24 is connected to a grounding potential 54 via a branch point 53. The resistor 52 is provided between the branch point 53 and the grounding potential 54. In addition, the branch point 53 is connected to an inverting input terminal 72 of the comparator 47. Therefore, the sense current Is, received from the sense IGBT 24, flows through the resistor 52 via the branch point 53 and then to the grounding potential 54. The potential of the branch point 53 is input to the inverting input terminal 72 of the comparator 47. The potential of the comparison potential 48 is input to a non-inverting input terminal 73 of the comparator 47. If the potential received by the inverting input terminal 72 becomes higher than the comparison potential 48 received by the non-inverting input terminal 73, the comparator 47 changes the level of the signal output from an output terminal 71 from HIGH to LOW. This change in the signal level allows the control device 12 to determine whether the potential at the branch point 53 becomes higher than the comparison potential 48 (that is, whether the current value of the current flowing through the power device 6 exceeds the threshold 108 (see FIG. 2)).

The threshold 108 (FIG. 2) is determined based on the current value of the current flowing through the power device 6, for example, when a short circuit occurs between the upper arm 61 and the lower arm 62. For example, the threshold 108 is a value generated by adding a predetermined allowance value to the maximum value of the collector current $I_{ce}$ that flows through the power device 6 during the normal operation.

Next, the operation of the switching control circuit 10 in this exemplary embodiment is described with reference to FIG. 2 and FIG. 3. During an off period 130, the power device 6 is turned off (FIG. 2). During the off period 130, a voltage that turns on the power device 6 is not applied to the gate 21. More specifically, during the off period 130, the switching device 33 is turned on while the switching devices 41, 34, and 35 are turned off. As a result, the voltage of the grounding potential 37 is applied to the gate 21.

When the gate-on instruction is received, the control device 12 turns on the power device 6. More specifically, when the gate-on instruction is received, the control device 12 applies the first gate voltage $V_{g1}$ to the gate 21 of the power device 6 (S2). More specifically, the control device 12 turns on the switching device 41 and the switching device 33 (step S2). This makes the path conductive that is formed by the reference potential 40, gate driving line 65, gate driving line 66, and grounding potential 37 sequentially arranged in this order. When this path becomes conductive, the current flows from the reference potential 40 to the grounding potential 37 via the gate driving line 65 and the gate driving line 66. This current causes the first gate voltage $V_{g1}$ to be applied to the gate 21. In this case, the relation $V_{g1}=(V_{cc}-V_{37})\cdot R_{16}/(R_{15}+R_{16})$ holds where $V_{g1}$ is the first gate voltage, $V_{cc}$ is the potential of the reference potential 40, $V_{37}$ is the potential of the grounding potential 37, $R_{15}$ is the resistance value of the resistor 15, and $R_{16}$ is the resistance value of the resistor 16.

Next, the control device 12 enters the wait state until a first turn-on period 131 elapses after the switching device 41 and the switching device 33 are turned on (S4). In this exemplary embodiment, the first turn-on period 131 starts when the switching devices 41 and 33 are turned on in step S2. Until the first turn-on period 131 elapses, the control device 12 does not determine, based on the signal received from the comparator 47, whether the current value of the current flowing through the power device 6 exceeds the threshold 108 (see FIG. 2). Therefore, the first turn-on period 131 is an example of a "first period" and a "first detection period". That is, the "first period" and the "first detection period" are set as the same period in this exemplary embodiment.

After the first turn-on period 131 has elapsed, the control device 12 applies the second gate voltage $V_{g2}$ to the gate 21 of the power device 6 (S6). More specifically, the control device 12 turns off the switching device 33 with the switching device 41 left turned on. This causes the potential $V_{cc}$ of the reference potential 40 to be applied to the gate 21. Note that the second gate voltage $V_{g2}$ is equal to the potential $V_{cc}$ of the reference potential 40.

In the switching control circuit 10 in this exemplary embodiment, it takes time from the time the control device 12 applies the second gate voltage $V_{g2}$ to the gate 21 of the power device 6 to the time the voltage of the gate 21 of the power device 6 reaches the second gate voltage $V_{g2}$. That is, until the potential of the gate 21 reaches the second gate voltage $V_{g2}$, it takes time determined by the gate capacity and the resistance value $R_{15}$. In the description below, the period during which the potential of the gate 21 is changed from the first gate voltage $V_{g1}$ to the second gate voltage $V_{g2}$ is called a second turn-on period 132 (an example of transition period); similarly, the period during which the potential of the gate 21 is maintained at the second gate voltage $V_{g2}$ is called a third turn-on period 133. Therefore, in the second turn-on period 132, the potential of the gate 21 is changing from the first gate voltage $V_{g1}$ to the second gate voltage $V_{g2}$. On the other hand, the third turn-on period 133 refers to the period after the second gate voltage $V_{g2}$ is applied to the gate 21. Therefore, the period corresponding to the total of the second turn-on period 132 and the third turn-on period 133 is an example of a "second period".

The amount of collector current $I_{ce}$, approximately proportional to the level of the gate voltage, flows through the power device 6 (FIG. 2). The switching control circuit 10 in this exemplary embodiment applies first the gate voltage $V_{g1}$, and then the second gate voltage $V_{g2}$ that is higher than the first gate voltage $V_{g1}$, to the gate 21 of the power device 6. That is, the switching control circuit 10 in this exemplary embodiment applies the gate voltage to the gate 21 in an incremental manner. Application the gate voltage in this manner can reduce electrical noises that may be generated when the power device 6 is turned on.

Next, the control device 12 determines whether the current value of the current flowing through the power device 6 exceeds the threshold 108 (FIG. 2) based on the signal received from the comparator 47 (S8). If the current value of the current flowing through the power device 6 does not exceed the threshold 108 (NO in S8), the processing proceeds to step S16 in which it is determined whether the gate-off instruction is received (S16). If the gate-off instruction is not received (NO in S16), the control device 12 returns control to step S8 to repeat the processing beginning in step S8. On the other hand, if the gate-off instruction is received (YES in S16), the control device 12 does not apply the gate voltage to the gate 21. More specifically, the control device 12 turns on only the switching device 33 and turns off the switching devices 41, 34, and 35. As a result, the potential of the grounding potential 37 is applied to the gate 21 and the power device 6 is turned off.

On the other hand, if the current value of the current flowing through the power device 6 exceeds the threshold 108 (YES in S8), the control device 12 determines whether the time is in a second detection period 142 (S10). If the time is in the second detection period 142, the control device 12 executes step S12; if the time is not in the second detection period 142, the control device 12 executes step S14.

The first detection period 141, second detection period 142, and third detection period 143 described above are periods classified according to the operation of the control device 12 when the control device 12 receives the signal from the comparator 47. The first detection period 141 starts when the control device 12 starts the period during which the control device 12 turns on the power device 6. The first detection period 141 is the so-called the mask period. In this exemplary embodiment, the start time of the first detection period 141 coincides with the start time of the first turn-on period 131 (FIG. 2). In the switching control circuit 10 in this exemplary embodiment, the end time of the first detection period 141 coincides with the end time of the first turn-on period 131. Note that the end time of the first detection period 141 need not always coincide with the end time of the first turn-on period 131. Even if the current value of the current flowing through the power device 6 exceeds the threshold 108 in the first detection period 141 (after step S2 is executed and before step S6 is executed), the control device 12 does not turn off the power device 6 (does not decrease the voltage of the gate 21). More specifically, even if the comparison information signal is received from the current detection circuit 13, the control device 12 does not turn off the power device 6.

In the switching control circuit 10, an inrush current generated at the turn-on time of the power device 6 sometimes causes the collector current to exceed the threshold 108. Usually, however, there is no need to turn off the power device 6 in this case. The control device 12 in this exemplary embodiment does not turn off the power device 6 in the first detection period 141 even if the current value of the current flowing through the power device 6 exceeds the threshold 108. Because of this, the control device 12 in this exemplary embodiment prevents the power device 6 from being mistakenly turned off when an inrush current exceeding the threshold 108 flows.

The amount of a short circuit current flowing through the power device 6 when a short circuit occurs is approximately proportional to the level of the gate voltage applied to the gate 21 at that time. In the switching control circuit 10 in this exemplary embodiment, not the second gate voltage $V_{g2}$, but the first gate voltage $V_{g1}$, is applied to the gate 21 during the first detection period 141. Because the first gate voltage $V_{g1}$ is lower than the second gate voltage $V_{g2}$, the amount of a short circuit current flowing through the power device 6 when a short circuit occurs in the first detection period 141 is kept low. Controlling the voltage applied to the gate 21 in this manner prevents the power device 6 from being destroyed even when a large amount of short circuit current flows in the first detection period 141 in which the power device 6 is not turned off.

The second detection period 142 is the period after the first detection period 141. In the switching control circuit 10 in this exemplary embodiment, the second detection period 142 starts when step 6 in FIG. 3 starts. That is, the start time of the second detection period 142 coincides with the start time of the second turn-on period 132. Note that the start time of the second detection period 142 need not always coincide with the start time of the second turn-on period 132. In other words, the start time of the second detection period 142 may be earlier than the start time of the second turn-on period 132. The start time of the second detection period 142 may also be later than the start time of the second turn-on period 132.

Unlike in the first detection period 141, the switching control circuit 10 performs detection, in the second detection period 142, to determine whether the current value of the current flowing through the power device 6 exceeds the threshold 108. If it is detected in the second detection period 142 that the current value of the current flowing through the power device 6 exceeds the threshold 108, the control device 12 decreases the gate voltage with a first speed (S12 in FIG. 3). The first speed is higher than the second speed described later. More specifically, the control device 12 turns on the switching device 34. When the switching device 34 is turned on, the gate driving line 67 becomes conductive. The resistance value $R_{17}$ of the resistor 17 provided on the gate driving line 67 is lower than the resistance value $R_{18}$ of the resistor 18 described later. As a result, the gate potential of the power device 6 decreases with the first speed that is higher than the second speed described later.

The switching control circuit 10 in this exemplary embodiment does not turn off the power device 6 in the first detection period 141 even if the current value of the current flowing through the power device 6 exceeds the threshold 108. This means that, when the current value of the current flowing through the power device 6 exceeds the threshold 108 in the first detection period 141, the current continues to flow into the power device 6. After that, when the second detection period 142 following the first detection period 141 starts, the control device 12 detects that the current value exceeds the threshold 108 and stops the current flowing through the power device 6. Therefore, when the control device 12 detects that the current value exceeds the threshold 108, there is a relatively high possibility that a large amount of energy is accumulated in the power device 6.

In the switching control circuit 10 in this exemplary embodiment, if it is detected that the current value exceeds the threshold 108 in the second detection period 142, the control device 12 turns off the power device 6 with the first speed that is higher than the second speed. Turning off the power device 6 with the first speed reduces the off-state power loss. The reduction in the off-time power loss, in turn, reduces the amount of energy applied to the power device 6 at turn-off time. As a result, this configuration prevents the destruction of the power device 6 that might be caused when the amount of energy, which is the total of the energy already accumulated and the energy applied at turn-off time, exceeds the energy tolerance limit of the power device 6.

Meanwhile, the end time of the second detection period 142 is set at a time earlier than the end time of the second turn-on period 132. The second turn-on period 132 is the period during which the voltage of the gate 21 is changing from the first gate voltage $V_{g1}$ to the second gate voltage $V_{g2}$. This means that the second gate voltage $V_{g2}$ is not applied to the gate 21 during the second detection period 142. Therefore, the amount of the current flowing through the power device 6 during the second detection period 142 is relatively small. Thus, turning off the power device 6 with the first speed during the second detection period 142 prevents the surge voltage from destroying the power device 6.

The third detection period 143 is the period after the second detection period 142 (FIG. 2). If it is detected in the third detection period 143 that the current value of the current flowing through the power device 6 exceeds the threshold 108, the control device 12 decreases the gate voltage with the second speed (step S14 in FIG. 3). The second speed is lower than the first speed. More specifically, the control device 12 turns on the switching device 35. When the switching device 35 is, turned on, the gate driving line 68 becomes conductive. The resistance value $R_{18}$ of the resistor 18 provided on the gate driving line 68 is higher than the resistance value $R_{17}$ of the resistor 17 described above. Therefore, the second speed is lower than the first speed (speed corresponding to the resistance value $R_{17}$ that is lower).

In the third detection period 143, there is a relatively high possibility that the second gate voltage $V_{g2}$ is applied to the gate 21. Therefore, there is a high possibility that the amount of the current flowing through the power device 6 is relatively large. If it is detected in the third detection period 143 that the current value of the current flowing through the power device 6 exceeds the threshold 108, the switching control circuit 10 in this exemplary embodiment turns off the power device 6 with the second speed that is lower. Therefore, even when a large amount of current is flowing through the power device 6, the switching control circuit 10 prevents a high surge voltage from being applied to the power device 6 when it is turned off. This, in turn, prevents the power device 6 from being destroyed by the surge voltage.

Meanwhile, when the power device 6 is turned off with the second speed that is lower than the first speed, the off-state power loss is large. The large off-state power loss results in a relatively large energy being applied to the power device 6 at turn-off time. However, unlike the second detection period 142, the third detection period 143 is not the period that follows the first detection period 141 in which the switching control circuit 10 does not perform the detection of the current value. This means that, when it is detected in the third detection period 143 that the current value exceeds the threshold 108, there is a relatively low possibility that a large amount of energy is accumulated in the power device 6. Therefore, even if the energy applied at turn-off time is added to the energy already accumulated, the total amount of energy applied to the power device 6 is relatively small. Because of this, there is a relatively low possibility that the total amount of energy applied to the power device 6 exceeds the energy tolerance limit of the power device 6.

As described above, the switching control circuit 10 prevents destruction caused by an amount of energy that exceeds the energy tolerance limit and, at the same time, prevents destruction caused by a surge voltage.

In the exemplary embodiment described above, the threshold 108 may be set according to the waveform of the collector current (FIG. 2). In other words, the value of the threshold 108 may be a value that is low in the first turn-on period 131, a value that is gradually increased in the second turn-on period 132, and a value larger than that in the first turn-on period 131 in the third turn-on period 133.

While the specific examples of the present invention have been described in detail above, they are only examples and do not limit the scope of the appended claims. The techniques disclosed in the claims include various modifications and alterations of the specific examples described above. Further, the technical elements described in this specification and the drawings exhibit technical usability alone or in combination. Furthermore, the techniques illustrated in the specification and drawings are intended for the simultaneous achievement of plurality of objects, and have technical utility by achieving any one of these objects.

What is claimed is:

1. A switching control circuit comprising:
   a voltage applier that applies a first voltage to a gate of a power device in a first period and applies a second voltage, that is higher than the first voltage, to the gate of the power device in a second period, the first period starting when the power device is switched from off to on, the second period starting after the first period has elapsed and ending when the power device is turned off;
   a current detector that detects whether a current flowing through the power device exceeds a threshold; and
   a voltage decreaser that decreases a gate voltage, which is applied to the gate of the power device, with a first speed if the current detector detects that the current flowing through the power device exceeds the threshold in a second detection period, and decreases the gate voltage with a second speed, which is lower than the first speed, if the current detector detects that the current flowing through the power device exceeds the threshold in a third detection period, the second detection period starting after a first detection period has elapsed, the first detection period starting from the time the power device is switched from off to on, the third detection period starting after the second detection period has elapsed, wherein
   in the first detection period, the power decreaser does not decrease the gate voltage of the power device even if the current detector detects that the current flowing through the power device exceeds the threshold, and
   the first detection period ends after the gate voltage of the power device reaches the first voltage.

2. The switching control circuit according to claim 1 wherein
   the voltage decreaser includes a first gate-off line that connects the gate of the power device and a grounding potential; a second gate-off line that connects the gate of the power device and a grounding potential; a first switching device that switches the first gate-off line between a conductive state and a non-conductive state; a second switching device that switches the second gate-off line between a conductive state and a non-conductive state; and a driving circuit that turns on/off the first switching device and the second switching device wherein
   a resistance value of the second gate-off line is higher than a resistance value of the first gate-off line and
   the driving circuit turns off the first switching device and the second switching device even if the current detector detects that the current flowing through the power device exceeds the threshold in the first detection period, turns on the first switching device and turns off the second switching device if the current detector detects that the current flowing through the power device exceeds the threshold in the second detection period, and turns off the first switching device and turns on the second switching device if the current detector detects that the current flowing through the power device exceeds the threshold in the third detection period.

3. A control method for a switching control circuit that switches a power device, which has an insulated gate, between on and off, the control method comprising:
  applying a first voltage to a gate of the power device until a first period elapses, the first period starting when the power device is switched from off to on;
  applying a second voltage that is higher than the first voltage to the gate of the power device in a second period, the second period starting after the first period has elapsed and ending when the power device is turned off;
  increasing a gate voltage, which is applied to the gate of the power device, from the first voltage to the second voltage in a transition period, the transition period starting at a start of the second period;
  not decreasing the gate voltage of the power device even if the current value of the current flowing through the power device exceeds a pre-set threshold in a first detection period, the first detection period starting from the time the power device is switched from off to on;
  decreasing the gate voltage with a first speed if a current value of a current flowing through the power device exceeds the threshold in a second detection period, the second detection period starting after the first detection period has elapsed; and
  decreasing the gate voltage with a second speed that is lower than the first speed if the current value of the current flowing through the power device exceeds the threshold in a third detection period, the third detection period starting after the second detection period has elapsed; wherein
  an end of the first detection period is later than a timing that the gate voltage of the power device reaches the first voltage, and
  an end of the second detection period is earlier than an end of the transition period.

* * * * *